United States Patent
Cho (10) Patent No.: US 7,554,845 B2
(45) Date of Patent: Jun. 30, 2009

(54) EEPROM CELL AND EEPROM BLOCK

(75) Inventor: Ki-Seok Cho, Chungcheongbuk-do (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 182 days.

(21) Appl. No.: 11/451,442

(22) Filed: Jun. 13, 2006

(65) Prior Publication Data
US 2006/0285389 A1 Dec. 21, 2006

(30) Foreign Application Priority Data
Jun. 17, 2005 (KR) .................. 10-2005-0052306

(51) Int. Cl.
*G11C 11/34* (2006.01)
*G11C 16/04* (2006.01)
(52) U.S. Cl. ............... 365/185.05; 365/185.11; 365/185.2; 365/185.18
(58) Field of Classification Search .......... 365/185, 365/185.05, 185.11, 185.2, 185.18
See application file for complete search history.

(56) References Cited
U.S. PATENT DOCUMENTS

| | | | | | |
|---|---|---|---|---|---|
| 4,510,584 A | * | 4/1985 | Dias et al. | ............... | 365/185.08 |
| 4,571,704 A | * | 2/1986 | Bohac, Jr. | ............... | 365/185.07 |
| 4,685,083 A | * | 8/1987 | Leuschner | ............. | 365/185.07 |
| 4,780,750 A | * | 10/1988 | Nolan et al. | ........... | 365/185.28 |
| 5,097,449 A | * | 3/1992 | Cuevas | ................... | 365/185.07 |
| 6,603,344 B2 | * | 8/2003 | Yung | .......................... | 327/525 |
| 7,307,872 B2 | * | 12/2007 | Kang et al. | ................. | 365/154 |

FOREIGN PATENT DOCUMENTS

| | | |
|---|---|---|
| KR | 1997-0003264 | 1/1997 |
| KR | 1997-0023377 | 5/1997 |
| KR | 1998-0084907 | 12/1998 |

* cited by examiner

*Primary Examiner*—Huan Hoang
*Assistant Examiner*—Michael J Weinberg
(74) *Attorney, Agent, or Firm*—Morgan Lewis & Bockius LLP

(57) ABSTRACT

The EEPROM cell includes a writing unit having a flash cell Metal Oxide Semiconductor (MOS) for receiving from outside a gate selection signal via a gate and a drain selection signal via a drain, and writing one bit data, and a high-voltage MOS whose source is connected to a source of the flash cell MOS to have a symmetrical structure and for receiving the gate selection signal via a gate, and a sensing unit having a first sensing MOS whose source is connected to a power supply voltage, gate to a drain of a second sensing MOS and drain to the drain of the flash cell MOS, and the second sensing MOS whose source is connected to the power supply voltage, gate to the drain of the first sensing MOS and drain to the drain of the high-voltage MOS.

12 Claims, 5 Drawing Sheets

EEPROM CELL AND EEPROM BLOCK

FIELD OF THE INVENTION

The present invention relates to a nonvolatile memory capable of keeping data stored therein when an external power is interrupted, and more particularly, to an Electrically Erasable and Programmable Read Only Memory (EEPROM) built in a device such as a one-chip microcontroller or the like.

DESCRIPTION OF RELATED ART

It is well known that EEPROM is an electronic circuit that writes data as charged in a floating gate formed as dielectric in a flash cell Metal Oxide Semiconductor (MOS) transistor having the shape of MOS transistor device. This EEPROM may be implemented to use in computer systems, etc. as one auxiliary memory device by manufacturing as an independent chip device. Also, it may be implemented in an embedded shape as a storage device of data that needs to be kept when a power is cut off in a one-chip microcontroller.

In universal microcontrollers or smart chips for smart card, since an embedded EEPROM having capacity of more than several Kbytes is required, a row/column decoder should be used for read/write access of specific cell, like an independent device, a selection transistor should be prepared in each unit flash cell and two kinds of powers should be supplied for each of read/write at the time of its operation.

However, in case where the embedded EEPROM is utilized for correcting a gradation value of a display panel in an LCD driver or a frequency of an oscillator, only cells of the capacity not more than dozens of bytes are needed. In these applications, such a conventional structure using the row/column decoder and the selection transistor is inefficient and not economical.

SUMMARY OF THE INVENTION

It is, therefore, an object of the present invention to provide an embedded EEPROM cell that can save manufacturing cost of an overall chip and an EEPROM block having the same.

Another object of the invention is to provide an EEPROM cell having a structure capable of allowing its design burden to be reduced and an EEPROM block having the same.

Still another object of the invention is to offer an EEPROM cell having a structure capable of improving its reliability by strengthening resistibility against noise and an EEPROM block having the same.

In accordance with the present invention, there is provided an EEPROM cell including: a writing unit having a flash cell MOS for receiving a gate selection signal from outside via a gate and a drain selection signal from the outside via a drain, and writing one bit data, and a high-voltage MOS whose source is connected to a source of the flash cell MOS to have a symmetrical structure and for receiving the gate selection signal via a gate; and a sensing unit having a first sensing MOS whose source is connected to a power supply voltage, gate to a drain of a second sensing MOS and drain to the drain of the flash cell MOS, and the second sensing MOS whose source is connected to the power supply voltage, gate to the drain of the first sensing MOS and drain to the drain of the high-voltage MOS, wherein a gate voltage of the first sensing MOS is provided as a positive output signal and a gate voltage of the second sensing MOS is outputted as a negative output signal.

The other objectives and advantages of the invention will be understood by the following description and will also be appreciated by the embodiments of the invention more clearly. Further, the objectives and advantages of the invention will readily be seen that they can be realized by the means and its combination specified in the claims.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, preferred embodiments of the present invention will be set forth in detail with reference to the accompanying drawings. First, it should be noted that the terms and words used in the specification and claims should not be limited to general or dictionary meanings but be interpreted as meanings and concepts which coincide with the technical spirit of the invention under the principle that the inventor(s) may properly define the concept of the terms to explain his/her own invention in the best way. Accordingly, the embodiments disclosed herein and constructions shown in the drawings don't teach all of the technical spirit of the invention but are merely the most preferred ones of the invention. Therefore, those in the art will appreciate that various modifications, substitutions and equivalences may be made, without departing from the scope of the invention as defined in the accompanying claims.

Figure 1:
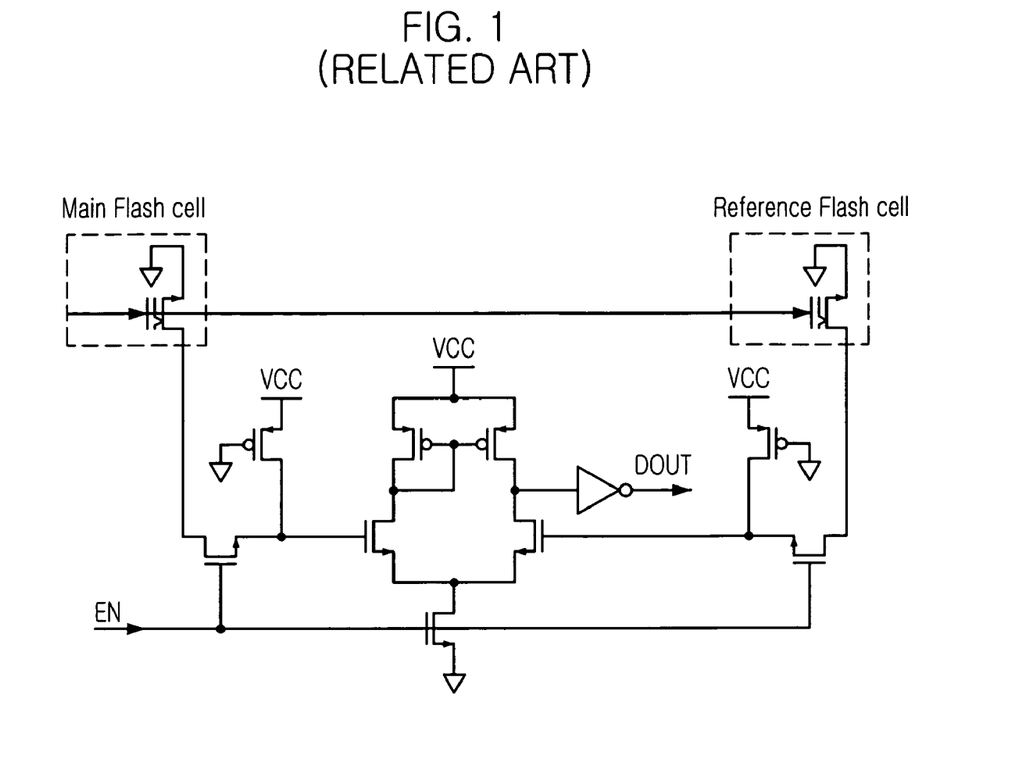
FIG. 1 is a circuit diagram showing a structure of a conventional EEPROM cell and its sense amp.
Figure 2:
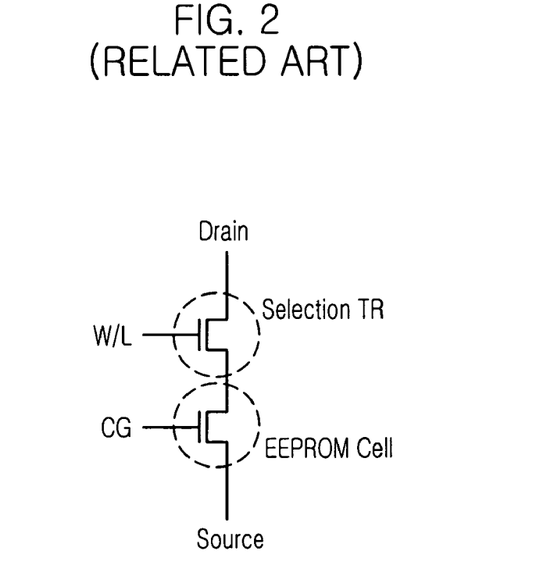
FIG. 2 shows a structure of the EEPROM flash cell of FIG. 1.
Figure 3:
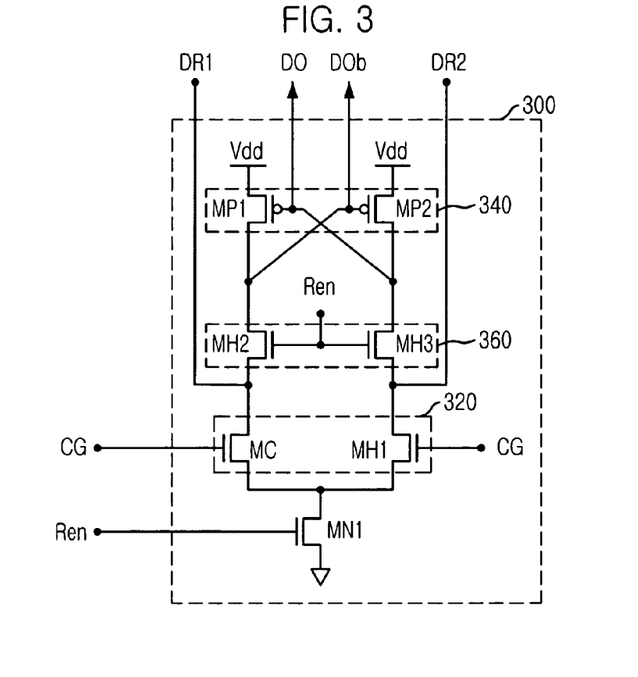
FIG. 3 is a circuit diagram illustrating a structure of an EEPROM cell in accordance with a preferred embodiment of the present invention.

An EEPROM cell of this embodiment as shown in FIG. 3 includes a writing unit 320 having a flash cell MOS MC for receiving a gate selection signal CG from outside via a gate and a drain selection signal DR1 from the outside via a drain and writing one bit data, and a high-voltage MOS MH1 whose source is connected to a source of the flash cell MOS MC to have a symmetrical structure and for receiving the gate selection signal CG via a gate, and a sensing unit 340 having a first sensing MOS MP1 whose source is connected to a power supply voltage Vdd, gate to a drain of a second sensing MOS MP2 and drain to the drain of the flash cell MOS through MH2, and the second sensing MOS MP2 whose source is connected to the power supply voltage Vdd, gate to the drain of the first sensing MOS MP1 and drain to the drain of the high-voltage MOS MH1 through MH3.

The high-voltage MOS MH1 has a threshold voltage that is adjacent to an intermediate value between a minimum value and a maximum value of a threshold voltage of the flash cell MOS MC. A general flash cell MOS has a threshold voltage of about 4 V when a floating gate is charged and of about −3 V when it is discharged. Therefore, the threshold voltage of the high-voltage MOS MH1 for voltage comparison is preferably 0.5 V [4+(−3)/2]. However, since the threshold voltage of the general high-voltage MOS is sufficiently marginal although it is considered to be near to 1 V, the general high-voltage MOS may be used as it is. At this time, the reason for use of the high-voltage MOS transistor device is to endure a high voltage of about 14 V applied to the drain during data programming.

A first cut-off MOS MH2 and a second cut-off MOS MH3 as shown serve to prevent a sensing operation by the sensing unit 340 during programming. And also, they, which are composed of MOS transistors for high voltage, function to prevent the high voltage applied to a drain line from being forwarded to the sensing unit 340 during the programming operation.

One of the key features of the present invention is that the sensing unit 340 as shown is involved for each memory cell. This can decrease an area by implementing the sensing MOSs MP1 and MP2 with low-voltage devices since it is interrupted to apply the high voltage to the sensing unit 340. The embedded EEPROM implemented by the present embodiment is small in capacity; and thus, it utilizes the point that the sensing unit 340 is implemented for each cell as shown, which is simple compared to having one sense amplifier and a decoding device for connecting this.

The EEPROM memory cell of this embodiment transmits read data to an external Flip-Flop (F/F) via a pair of output lines, wherein a gate voltage of the first sensing MOS MP1 is provided to the F/F as a positive output signal DO and a gate voltage of the second sensing MOS MP2 is applied to the F/F as a negative output signal DOb.

Figure 4:
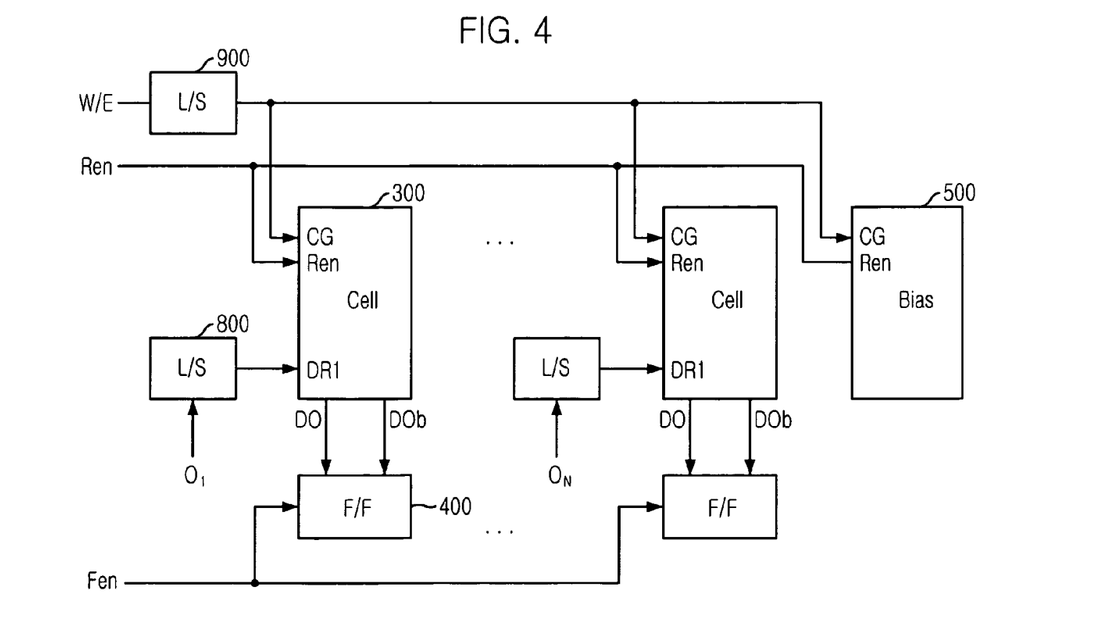
FIG. 4 shows a structure of an EEPROM block including the EEPROM memory cell of FIG. 3.

FIG. 4 shows a structure of an EEPROM memory block including the EEPROM memory cell of FIG. 3. The unit storage structure that stores one bit as shown includes the EEPROM memory cell 300 of FIG. 3, a latch 400 for receiving and latching stored data from the memory cell 300, and a drain Level Shifter (L/S) 800 for applying data during the programming operation.

The latch 400 can be implemented with F/Fs so that an arithmetic unit within a chip incorporating therein the EEPROM memory of the invention can read out the data. Further, in case where the arithmetic unit assigns an identification value or address to each storage location, it can be implemented in such a manner that one of the F/Fs is selected based on the identification value.

The drain L/S 800 applies a voltage of 14 V or 0 V depending on a bit value of each digit during the programming operation, that is, during a writing operation of cell data. In case where the EEPROM of this embodiment indicates the write of "1" value in a floating gate of the EEPROM cell MOS as a negative electric charge, the drain L/S outputs a voltage of 14 V when a bit value "1" is inputted and of 0 V when a bit value "0" is inputted.

As signals commonly applied to all of the unit storage structures of the EEPROM cell 300 as shown, there are a write enable signal W/E and a read enable signal Ren. The write enable signal W/E is applied to a control gate CG of each EEPROM cell 300. The structure as shown is provided with a gate L/S 900 for generating a high voltage to be applied to the control gate during the programming or writing operation and a bias voltage generator 500 for producing a low voltage, 1.2 V, to be applied to the control gate during a read operation. A device should be arranged in the bias voltage generator 500 to cut off the high voltage that can be applied during the programming operation. The gate L/S 900 produces a high voltage in response to an activated write enable signal; and this is well known in the art and thus its details will be omitted here.

Figure 5:
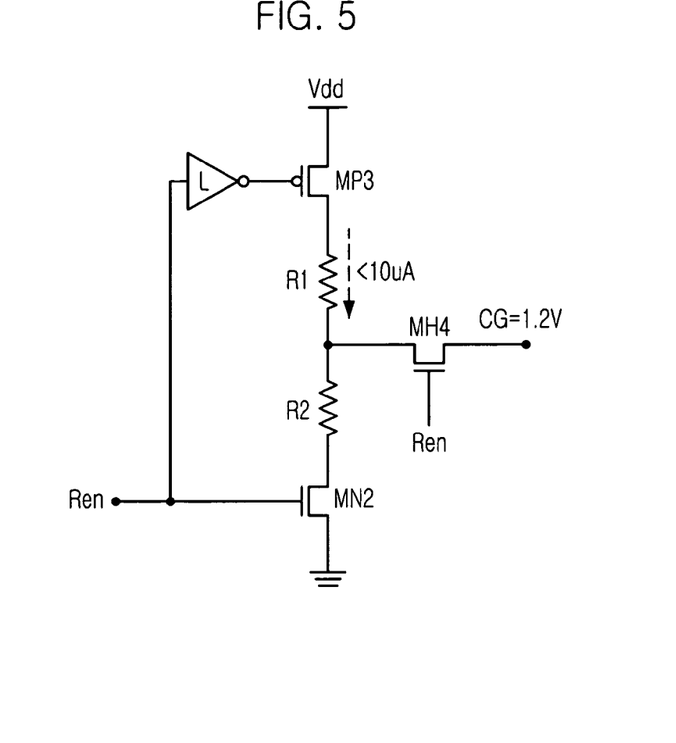
FIG. 5 is a circuit diagram showing a structure of the bias voltage generator of FIG. 4.

FIG. 5 exemplifies one example of the bias voltage generator 500. The bias voltage generator 500 as shown includes a first voltage dividing resistor R1 whose one end is connected to a power supply voltage Vdd, a second voltage dividing resistor R2 whose one end is connected to the other end of the first voltage dividing resistor R1 and other end to a ground voltage, an output MOS MH4 whose drain is connected to the other terminal of the first voltage dividing resistor R1 and for receiving the read enable signal Ren via a gate and outputting a generated bias voltage via a source, and a power controller MP3 and MN2 for switching the first and the second voltage dividing resistors R1 and R2 to the power supply voltage and/or the ground voltage in response to the read enable signal Ren.

The bias voltage generation using the first and the second voltage dividing resistors R1 and R2 is well known in the art; and therefore, details thereof will be omitted here. The power controller includes a first power control MOS MP3 whose drain is connected to one end of the first voltage dividing resistor R1 and source to the power supply voltage and for receiving an inverted signal of the read enable signal Ren via a gate, and a second power control MOS MP2 whose drain is connected to the other end of the second voltage dividing resistor R2 and source to the ground voltage and for receiving the read enable signal Ren via a gate. The power controller is configured to prevent the power from being supplied to the first and the second voltage dividing resistors R1 and R2 for an interval for which no issuance of the bias voltage is needed, i.e., for an inactivated interval of the read enable signal Ren. Alternatively, the power controller may be excluded if power saving is not required.

The output MOS MH4 performs not only the role of outputting the bias voltage generated only when the read enable signal Ren is activated but also of preventing the high voltage, e.g., 14 V, carried on an output line from being entered to the interior of the bias voltage generator during the programming operation. Therefore, it may be preferable to implement with a high-voltage MOS transistor that is sufficient to interrupt the high voltage.

Figure 6:
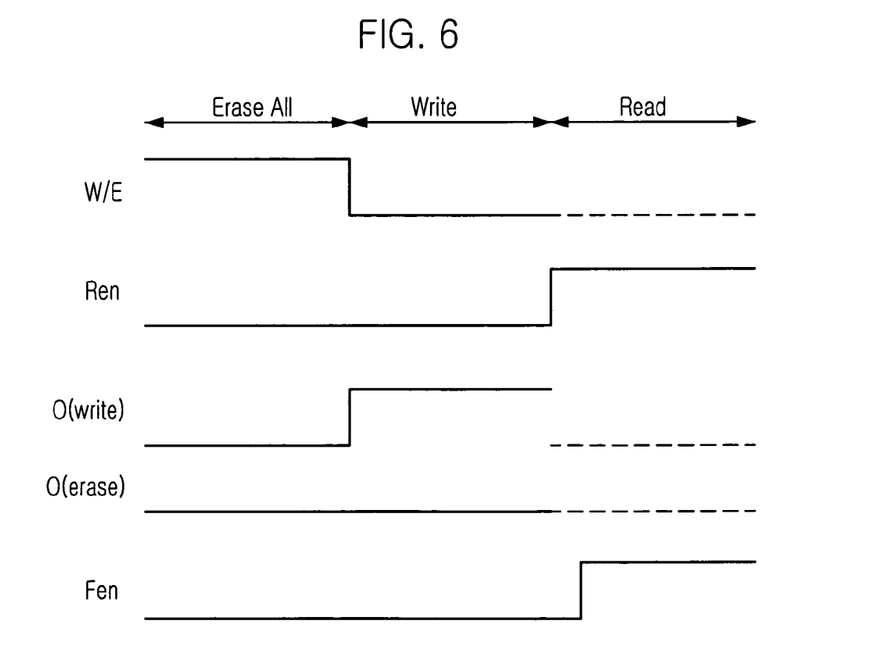
FIG. 6 is a view showing waveforms of signals applied to the EEPROM cell of the present invention.

FIG. 6 shows a logic state when the write enable signal W/E, the read enable signal Ren and a data signal "O" for each bit are erased, programmed, and read out. More concrete voltages applied to each input line of the EEPROM memory cell for each operation are as follows. That is, in the case of the memory cell to which a bit value of "$O_N$" is inputted, applied thereto are voltage levels of VCG=0, Ren=0 and DR1=14 V during the programming operation, of VCG=14 V, Ren=0 and DR1=0 during the erasing operation, and of VCG=1.2 V, Ren=high (2.4 V) and DR1=floating during the reading operation.

Now, an operation of the EEPROM memory cell 300 of this embodiment will be described below in detail with reference to FIGS. 3 to 5.

The Programming and reading conditions of the flash cell MOS constituting the EEPROM memory cell are as follows. First, 0 V is applied to the control gate and a high voltage, e.g., 14 V to a drain in order to write in the flash cell MOS. At this time, a threshold voltage of the written flash cell MOS becomes about −3 V, which is much lower than that of a general high-voltage NMOS device. Conversely, a high voltage is applied to the control gate and 0 V to the drain in order to erase the written cell. At this time, the threshold voltage of the erased cell becomes about 4 V, which is much higher than that of the general high-voltage NMOS device. When it is intended to read out the cell so programmed, a low voltage, e.g., 1.2 V is applied to the control gate and 1.2 V to the drain, and thereafter, a current of that cell is read out. If the current is greater than a reference value, e.g., 50 µA, it is recognized as a programmed cell, i.e., high value; and if not, it is recognized as a erased cell, i.e., low value.

A sense amp structure formed when the read enable signal Ren is activated is a structure of a pair of differential amplifiers composed of one memory cell MOS and one general high-voltage NMOS device that belong to the writing unit 320. This structure is identical to that of the general L/S except for the first cut-off MOS MH2 and the second cut-off MOS MH3 which are for high-voltage protection switches. That is, if the flash cell MOS MC was programmed, its threshold voltage is much less than that of the high-voltage MOS MH1; and thus, the flash cell MOS MC and the high-voltage MOS MH1 are fighting with each other, thus making the output DO near to Vdd. The read enable signal Ren becomes an activation state during the read operation and serves to hold the power supply voltage and the ground voltage of the sense amp structure. During the programming operation, the read enable signal Ren becomes a low state to float the sensing unit 340 and the writing unit 320 from the power supply voltage and the ground voltage. The first cut-off MOS MH2 and the second cut-off MOS MH3 serves as a protection switch to protect the sensing unit 340 that is low-voltage PMOS transistor device from the high voltage applied to the drain of the memory cell during the programming operation.

The bias voltage generator 500 is a bias generator circuit to apply the low voltage to the control gate. Since the high voltage is taken to the control voltage, any device for cutting off the high voltage should be also prepared in the bias voltage generator 500. In this embodiment, the output MOS MH4 is implemented with a MOS transistor for high voltage. To generate the control gate voltage, i.e., 1.2 V, during the read operation, the bias voltage generator 500 of this embodiment is provided with the first and the second voltage dividing resistors R1 and R2. If the read enable signal Ren becomes a high state, the first and the second power control MOSs MN2 and MP3 are turned on and thus R1=R2 during the read operation, then the control gate voltage 1.2 V [0.5*Vdd(2.4 V)] is generated. During the programming operation, the read enable signal Ren becomes a low state, no current is flowed through the first voltage dividing resistor R1 and the second voltage dividing resistor R2.

Figure 7:
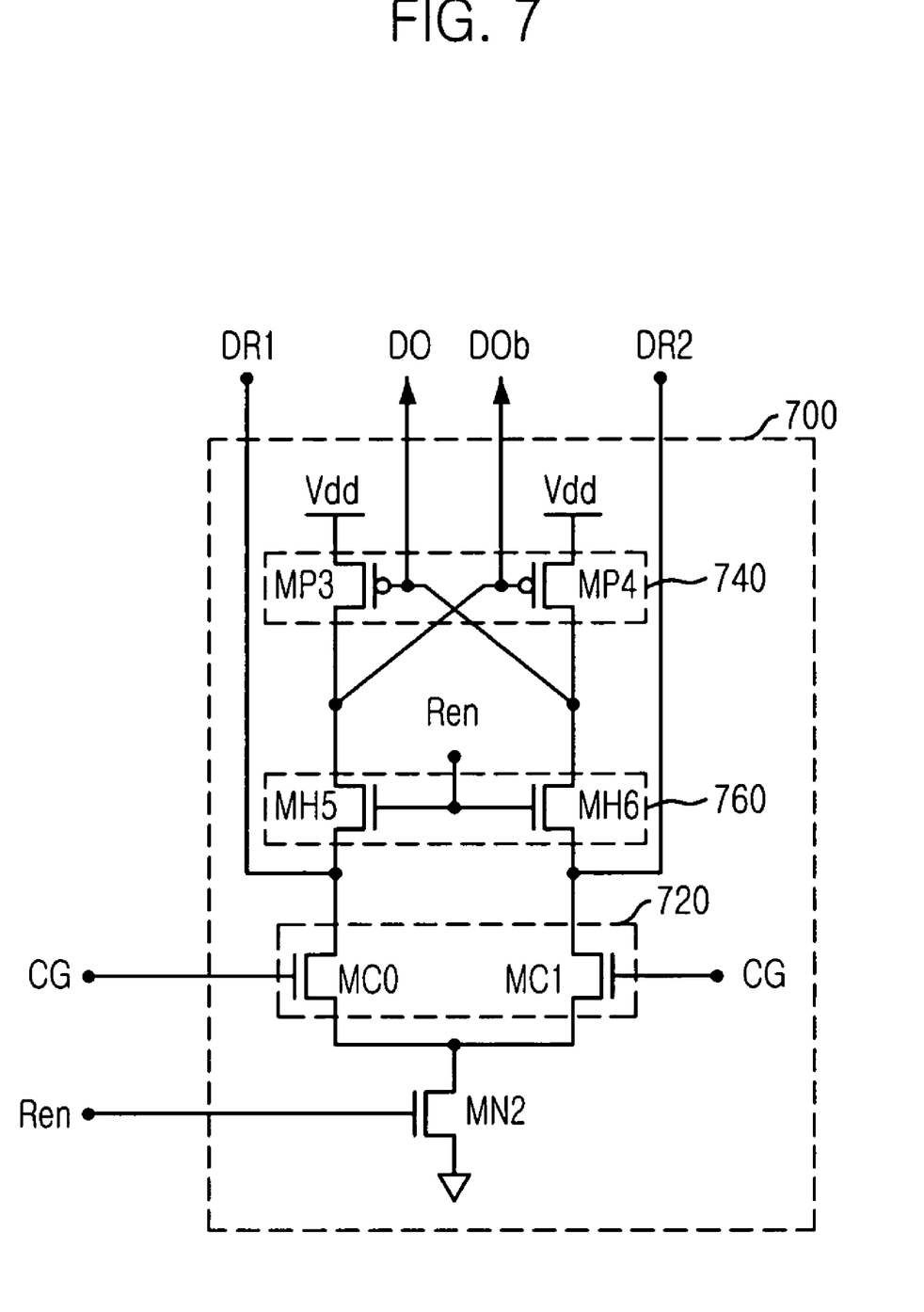
FIG. 7 is a circuit diagram exemplifying a structure of an EEPROM block in accordance with another embodiment of the present invention.

An EEPROM cell 700 of this embodiment as shown in FIG. 7 includes a writing unit 720 having a first flash cell MOS MC0 for receiving a gate selection signal CG from outside via a gate and a drain selection signal DR1 from the outside via a drain, and writing one bit data, and a second flash cell MOS MC1 for receiving the gate selection signal CG from the outside via a gate and a drain selection signal DR2 from the outside via a drain, and writing data complementary to the data written in the first flash cell MOS MC0, and a sensing unit 740 having a first sensing MOS MP3 whose source is connected to a power supply voltage and gate to a drain of a second sensing MOS MP4 and drain to the drain of the first flash cell MOS MC0 through MH5, and the second sensing MOS MP4 whose source is connected to the power supply voltage and gate to the drain of the first sensing MOS MP3 and drain to the drain of the second flash cell MOS MC1 through MH6.

This embodiment programs the data in the first and the second flash cell MOSs MC0 and MC1 in a complementary manner. In other words, an electric charge is trapped into only a floating gate of any one of the flash cell MOSs depending on a logic value to be written. Therefore, the sensing margin is increased two times compared to the prior art and the first embodiment. The rest of this embodiment is the same as the first embodiment; and thus, its detailed explanation will be omitted.

Figure 8:
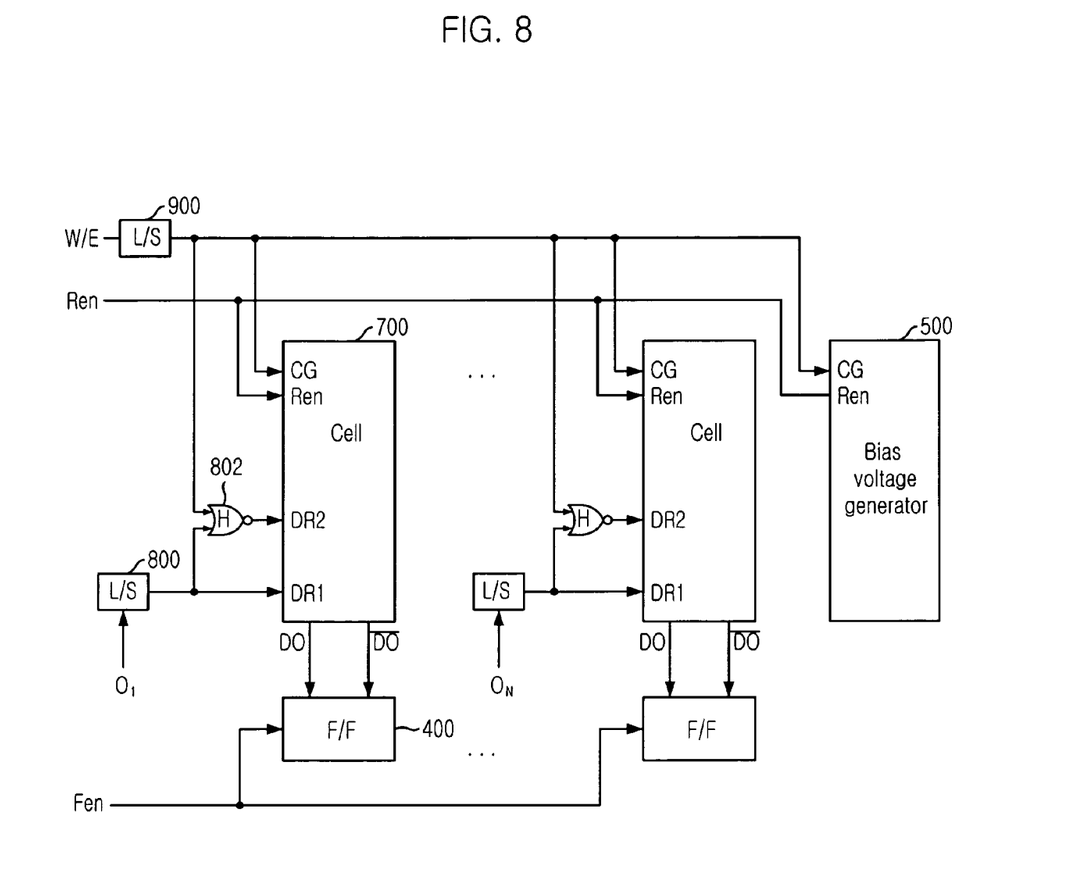
FIG. 8 shows a circuit diagram illustrating a structure of an EEPROM block including the EEPROM cell of FIG. 7.

FIG. 8 shows a circuit diagram illustrating a structure of an EEPROM memory block including the EEPROM memory cell 700 of FIG. 7. As shown therein, the unit storage structure that stores one bit includes the EEPROM memory cell 700 of FIG. 7, a latch 400 for receiving and latching stored data from the memory cell 700, a drain L/S 800 for applying data to a non-inverting data terminal of the memory cell 700 during the programming operation, and an inversion input unit 802 for providing an inverted signal of an output signal of the drain level shifter 900 to the non-inverting data terminal of the memory cell 700 during the programming operation.

In this embodiment, the inversion input unit 802 is implemented with a NOR gate that accepts and NOR-operates a write enable signal W/E and an output signal of the drain level shifter 900 and then outputs a NOR-operated value to the non-inverting data terminal of the memory cell 700. The output signal of the inversion input unit 802 should have a logical level of high voltage, 14 V, at the time of programming. The configuration except for the inversion input unit 802 is identical to that of the first embodiment; and therefore, details thereof will be omitted.

By applying the embedded EEPROM of the present invention to a System on a Chip (SoC) device, etc., the manufacturing cost and/or area of an overall chip can be saved.

Furthermore, the embedded EEPROM in accordance with the present invention has an advantage in that it allows a burden on design of a SoC device, etc. that incorporate therein the embedded EEPROM to be reduced.

Moreover, another merit of the embedded EEPROM in accordance with the present invention is that it can improve its reliability by strengthening resistibility against noise.

The present application contains subject matter related to Korean patent application No. 2005-52306, filed with the Korean Intellectual Property Office on Jun. 17, 2005, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An Electrically Erasable and Programmable Read Only Memory (EEPROM) cell comprising:

a writing unit including a flash cell Metal Oxide Semiconductor (MOS) for receiving a gate selection signal from outside via a gate and a drain selection signal from the outside via a drain, and writing one bit data, and a high-voltage MOS whose source is connected to a source of the flash cell MOS to have a symmetrical structure with the flash cell MOS for receiving the gate selection signal via a gate; and a sensing unit including a first sensing MOS having a source connected to a power supply voltage, a gate connected to a drain of a second sensing MOS and a drain connected to the drain of the flash cell MOS, and the second sensing MOS having a source connected to the power supply voltage, a gate connected to the drain of the first sensing MOS and the drain connected to the drain of the high-voltage MOS, wherein a gate voltage of the first sensing MOS is provided as a positive output signal and a gate voltage of the second sensing MOS is outputted as a negative output signal.

2. The EEPROM cell as recited in claim 1, further comprising:
a high-voltage protection unit including a first cut-off MOS whose drain is connected to the drain of the first sensing MOS and source to the drain of the flash cell MOS and for receiving a read enable signal provided from the outside via a gate; and
a second cut-off MOS whose drain is connected to the drain of the second sensing MOS and source to the drain of the high-voltage MOS and for receiving the read enable signal from the outside via a gate.

3. The EEPROM cell as recited in claim 1, further comprising an enable MOS having a drain connected to the source of the flash cell MOS and the source of the high-voltage MOS and a source connected to a ground voltage for receiving a read enable signal from the outside via a gate.

4. An EEPROM cell comprising:
a writing unit including a first flash cell MOS for receiving a gate selection signal from outside via a gate and a first drain selection signal from the outside via a drain, and writing one bit data, and a second flash cell MOS for receiving the gate selection signal from the outside via a gate and a second drain selection signal from the outside via a drain, and writing data complementary to the data written in the first flash cell MOS; and
a sensing unit including a first sensing MOS having a source connected to a power supply voltage and a gate connected to a drain of a second sensing MOS and a drain connected to the drain of the first flash cell MOS, and the second sensing MOS having a source connected to the power supply voltage and a gate connected to the drain of the first sensing MOS and the drain connected to the drain of the second flash cell MOS,
wherein a gate voltage of the first sensing MOS is provided as a positive output signal and a gate voltage of the second sensing MOS is outputted as a negative output signal.

5. The EEPROM cell as recited in claim 4, further comprising a high-voltage protection unit including a first cut-off MOS having a drain connected to the drain of the first sensing MOS and a source connected to the drain of the first flash cell MOS for receiving a read enable signal from the outside via a gate; and
a second cut-off MOS having a drain connected to the drain of the second sensing MOS and a source connected to the drain of the second flash cell MOS for receiving the read enable signal from the outside via a gate.

6. The EEPROM cell as recited in claim 4, further comprising an enable MOS having a drain connected to the sources of the first and the second flash cell MOSs and a source connected to a ground voltage for receiving a read enable signal from the outside via a gate.

7. An EEPROM block comprising:
an EEPROM cell;
a bias voltage generator for generating a control gate voltage of a flash cell MOS in the EEPROM cell during a reading operation;
a latch for temporarily latching output data from the EEPROM cell;
a drain level shifter for generating a drain voltage of the flash cell MOS in the EEPROM cell during a programming or erasing operation; and
a gate level shifter for generating a control gate voltage of the flash cell MOS in the EEPROM cell during the programming or erasing operations, wherein the EEPROM cell includes:
a writing unit including a first flash cell MOS for receiving a gate selection signal from outside via a gate and a first drain selection signal from the outside via a drain, and writing one bit data, and a second flash cell MOS for receiving the gate selection signal from the outside via a gate and a second drain selection signal from the outside via a drain, and writing data complementary to the data written in the first flash cell MOS; and
a sensing unit including a first sensing MOS having a source connected to a power supply voltage and a gate connected to a drain of a second sensing MOS and a drain connected to the drain of the first flash cell MOS, and the second sensing MOS having a source connected to the power supply voltage and a gate connected to the drain of the first sensing MOS and the drain connected to the drain of the second flash cell MOS,
wherein a gate voltage of the first sensing MOS is provided as a positive output signal and a gate voltage of the second sensing MOS is outputted as a negative output signal.

8. The EEFROM block as recited in claim 7, wherein the EEPROM cell further includes:
a high-voltage protection unit including a first cut-off MOS having a drain connected to the drain of the first sensing MOS and a source connected to the drain of the first flash cell MOS for receiving a read enable signal from the outside via a gate; and
a second cut-off MOS having a drain connected to the drain of the second sensing MOS and a source connected to the drain of the second flash cell MOS for receiving the read enable signal from the outside via a gate.

9. The EEPROM block as recited in claim 7, wherein the EEFROM cell further includes an enable MOS a drain connected to the sources of the first and the second flash cell MOSs and a source connected to a ground voltage for receiving a read enable signal from the outside via a gate.

10. An EEPROM block comprising:
an EEPROM cell;
a bias voltage generator for generating a control gate voltage of a first and a second flash cell MOSs included in the EEPROM cell during a reading operation;
a latch for temporarily latching output data from the EEPROM cell;
a drain level shifter for generating a drain voltage of the first and the second flash cell MOSs in the EEFROM cell during a programming or erasing operation; and
a gate level shifter for generating a control gate voltage of the first and the second flash cell MOSs in the EEPROM cell during the programming or erasing operation,
wherein the EEPROM cell includes:
a writing unit including a flash cell Metal Oxide Semiconductor (MOS) for receiving a gate selection signal from outside via a gate and a drain selection signal from the outside via a drain, and writing one bit data, and a high-voltage MOS whose source is connected to a source of the flash cell MOS to have a symmetrical structure with the flash cell MOS for receiving the gate selection signal via a gate; and
a sensing unit including a first sensing MOS having a source connected to a power supply voltage, a gate connected to a drain of a second sensing MOS and a drain connected to the drain of the flash cell MOS, and the second sensing MOS having a source is connected to the power supply voltage, a sate connected to the drain of the first sensing MOS and the drain connected to the drain of the high-voltage MOS, wherein a gate voltage of the first sensing MOS is provided as a positive output signal and a gate voltage of the second sensing MOS is outputted as a negative output signal.

11. The EEPROM block as recited in claim 10, wherein the EEPROM cell further includes:

a high-voltage protection unit including a first cut-off MOS having a drain connected to the drain of the first sensing MOS and a source connected to the drain of the flash cell MOS for receiving a read enable signal provided from the outside via a gate; and a second cut-off MOS having a drain connected to the drain of the second sensing MOS and a source connected to the drain of the high-voltage MOS for receiving the read enable signal from the outside via a gate.

12. The EEPROM cell as recited in claim 10, wherein the EEPROM cell further includes an enable MOS having a drain connected to the source of the flash cell MOS and the source of the high-voltage MOS and a source connected to a ground voltage for receiving a read enable signal from the outside via a gate.

* * * * *